United States Patent [19]

Schemenaur et al.

[11] Patent Number: 6,117,250

[45] Date of Patent: Sep. 12, 2000

[54] THIAZOLE AND THIOCARBAMIDE BASED CHEMICALS FOR USE WITH OXIDATIVE ETCHANT SOLUTIONS

[75] Inventors: John Schemenaur, Scottsdale; Lee Ellershaw, Phoenix; Todd Johnson, Temple; Michael Marsaglia, Chandler, all of Ariz.

[73] Assignee: Morton International Inc., Chicago, Ill.

[21] Appl. No.: 09/257,332

[22] Filed: Feb. 25, 1999

[51] Int. Cl.$^7$ ................................................... C23C 22/02
[52] U.S. Cl. ............................................. 148/248; 148/283
[58] Field of Search .................................. 148/243, 269, 148/282, 283, 284, 248

[56] References Cited

U.S. PATENT DOCUMENTS

| | | | |
|---|---|---|---|
| Re. 32,555 | 12/1987 | Czaja | 252/79.3 |
| 2,746,848 | 5/1956 | Jones | 41/42 |
| 3,114,657 | 12/1963 | Stilwell | 134/28 |
| 3,136,670 | 6/1964 | Rogers et al. | 156/13 |
| 3,148,100 | 9/1964 | Elston et al. | 156/14 |
| 3,216,873 | 11/1965 | Jones | 156/14 |
| 3,293,093 | 12/1966 | Jones et al. | 156/18 |
| 3,312,625 | 4/1967 | Peterson | 252/149 |
| 3,341,384 | 9/1967 | Alderuccio et al. | 156/18 |
| 3,407,141 | 10/1968 | Banush et al. | 252/79.4 |
| 3,458,371 | 7/1969 | Borth et al. | 156/14 |
| 3,458,372 | 7/1969 | Borth et al. . | |
| 3,649,194 | 3/1972 | Glanville . | |
| 3,668,131 | 6/1972 | Banush et al. . | |
| 3,770,530 | 11/1973 | Fujimoto . | |
| 3,948,703 | 4/1976 | Kushibe . | |
| 3,954,645 | 5/1976 | Otrhalek et al. . | |
| 3,969,260 | 7/1976 | Clark . | |
| 3,979,311 | 9/1976 | Clark . | |
| 3,992,313 | 11/1976 | Anderson et al. . | |
| 4,051,057 | 9/1977 | Ericson et al. . | |
| 4,086,128 | 4/1978 | Sugio et al. . | |
| 4,140,646 | 2/1979 | Kent et al. . | |
| 4,141,850 | 2/1979 | Readio et al. . | |
| 4,180,469 | 12/1979 | Anderson . | |
| 4,233,113 | 11/1980 | Valayil et al. . | |
| 4,459,216 | 7/1984 | Nakazato et al. . | |
| 4,642,161 | 2/1987 | Akahoshi et al. . | |
| 4,717,439 | 1/1988 | Hajdu et al. . | |
| 4,731,128 | 3/1988 | Casullo | 428/470 |
| 4,751,106 | 6/1988 | Wilkinson et al. . | |
| 4,784,785 | 11/1988 | Cordani et al. . | |
| 4,859,281 | 8/1989 | Goltz . | |
| 4,873,136 | 10/1989 | Foust et al. . | |
| 4,915,781 | 4/1990 | Bohnen et al. . | |
| 5,030,373 | 7/1991 | Kimura et al. . | |
| 5,037,482 | 8/1991 | Kukanskis et al. . | |
| 5,106,454 | 4/1992 | Allardyce et al. . | |
| 5,492,595 | 2/1996 | Carano et al. . | |
| 5,532,094 | 7/1996 | Arimura et al. . | |
| 5,538,152 | 7/1996 | Fontana . | |
| 5,770,095 | 6/1998 | Sasaki et al. | 216/38 |
| 5,800,859 | 9/1998 | Price et al. . | |
| 5,869,130 | 2/1999 | Ferrier . | |
| 5,954,997 | 9/1999 | Kaufman et al. | 252/79.1 |

*Primary Examiner*—John Sheehan
*Assistant Examiner*—Andrew L. Oltmans

[57] ABSTRACT

Metal surfaces, particularly copper surfaces, which are oxidatively micro-etched to increase surface area, are provided acid-resistance by exposure to a thiazole compound and/or a thiocarbamide compound. The thiazole compound and/or thiocarbamide compound may be provided either in the oxidative micro-etching solution or provided in a post-micro-etching solution.

21 Claims, No Drawings

THIAZOLE AND THIOCARBAMIDE BASED CHEMICALS FOR USE WITH OXIDATIVE ETCHANT SOLUTIONS

The present invention is directed to printed circuit boards, particularly multi-layer printed circuit boards. Specifically, the invention is directed to micro-etching of metal, particularly copper, printed circuitry by an oxidative process so as to improve adhesion of the metal circuitry to the dielectric layers of multi-layer circuit boards while at the same time providing acid-resistance to the metal circuitry. Because the major portion of printed circuitry is copper circuitry, the invention will be discussed herein primarily in relationship to copper printed circuitry. However, the invention is generally applicable to metal surfaces which can be oxidatively micro-etched to provide increased surface area; thus, discussions with respect to copper surfaces are to be understood to pertain to other metal surfaces which may be oxidatively micro-etched for surface area enhancement.

BACKGROUND OF THE INVENTION

Successful fabrication of multilayer printed circuit boards requires bonding together of copper and resin layers. However, direct bonding of copper and resin layers does not provide sufficient bonding strength. Therefore, it is common to improve copper-resin bonding strength by providing surface roughness to the copper surface, whereby mechanical bonding between the copper and resin is enhanced.

One common method of providing surface roughness is by depositing on the copper surface an oxide layer, such as cuprous oxide, cupric oxide, or the like. Formation of the oxide layer, which turns the pink copper surface a black-brown color, creates minute unevenness on the copper surface which provide an interlocking effect between the copper surface and resin, thus improving bonding strength.

However, copper oxides are readily degraded and dissolved upon contact with acid. Because various acid treatments are used in later stages of fabrication of multilayer circuit boards, oxide layer deposition has been problematic at best. In particular, through-holes are drilled through multilayer circuit boards, and the through-holes plated with copper to interconnect the circuitry of the several layers. As part of the copper-plating process, the through-holes are exposed to acids, such as HCl. Acid attack on the oxide layer in the region surrounding the through-holes is commonly referred to in the industry as "pink ring", because as acid strips the black-brown oxide layer from the surface, a ring of bare pink copper becomes evident. The problem of copper oxide vulnerability to acid has been approached in a number of patents, e.g. U.S. Pat. Nos. 4,642,161 and 4,717,439.

An alternative to building up a copper oxide coating on the copper surface is to micro-etch the copper surface to roughen the same; and it is to this method of surface roughening that the present invention is directed. Most commonly, this etching solution is an aqueous solution of a mineral acid, such as sulfuric acid, and hydrogen peroxide. Such a solution is described in U.S. Pat. No. 4,751,106, the teachings of which are incorporated herein by reference. The micro-etching process roughens the copper, probably by oxidation of the metallic copper; the resulting topography on the metal surface provides better adhesion to resin. The micro-etched surface appears light red/brown to a dark brown, probably the result of the topography of the surface and some residual copper oxide that is formed in the etching process. Micro-etched copper circuitry, when exposed to acid-based copper plating of through holes, is likewise subject to formation of "pink ring" through acid attack of the copper circuitry traces around the through-holes. The formation of "pink ring" is detrimental at least to appearance and is a potential cause of failure of multi-layer printed circuit boards.

It is a primary object of the present invention to provide acid-resistance to micro-etched copper circuitry so as to prevent or minimize acid attack problems such as "pink ring". In this regard, it is to be understood that there are a wide variety of possible processing steps in forming printed circuitry, and the invention, though described relative to a few common processing procedures, is generally applicable to providing acid-resistance to micro-etched copper.

SUMMARY OF THE INVENTION

In accordance with one aspect of the invention there is provided an oxidative aqueous etching solution for micro-etching metal surfaces so as to increase the surface area of the metal surface and at the same time provide acid resistance to the micro-etched metal surface. The solution contains a proton source; an oxidizer agent; an azole compound; a source of halogen ions; and a compound selected from the group consisting of a thiazole compound, a thiocarbamide compound, and mixtures thereof. This solution is used to micro-etch a metal, e.g., copper, surface. Very substantial improvements in acid-resistance is achieved through inclusion of the thiazole and/or thiocarbamide compound as evidenced by significantly longer times that it takes for an HCl solution to change the color of a micro-etched board from brown to pink. This improved acid resistance translates to elimination or minimization of "pink ring" in the formation of multi-layer printed circuit boards and elimination or minimization of other acid attack related problems in printed circuit board formation.

In accordance with another aspect of the invention, a metal surface is oxidatively micro-etched. Subsequently, the surface is post-treated with an aqueous solution of a thiazole compound, a thiocarbamide compound or a mixture thereof, the thiazole and/or thiocarabamide compound being provided at a level of at least about 0.01 wt %, preferably at least 0.2 wt %, up to saturation level(s).

DETAILED DESCRIPTION OF CERTAIN PREFERRED EMBODIMENTS

As stated above, although the discussion of this invention is primarily in respect to copper and copper alloys, the invention applies to any metal surface which may be oxidatively micro-etched, including, but not limited to, copper, nickel, cadmium, zinc, iron, aluminum, and alloys thereof. For purposes of this invention, an "alloy" of a metal is a mixture of metals containing at least 50 wt % of the designated metal. Herein, when the singular is used for a component, the plural is meant in the alternative; thus "thiazole compound" is intended to encompass either a single thiazole compound or a mixture of thiazole compounds. Also, in referring to a thiazole compound, a thiocarbamide compound or an azole compound, even if not otherwise stated, these terms are intended to encompass the salts of such compounds. Herein, the term "aqueous solution" is intended to mean a solution in which the primary solvent is water; however, the term is intended to encompass solutions containing up to about 49 wt % water-miscible co-solvents.

The micro-etching process in accordance with the present invention is to be distinguished from processes in which portions of a copper layer are etched completely through such as to form circuitry traces of a printed circuit board. In micro-etching, no portion of copper, e.g., copper circuitry traces, are etched completely away; rather, the surface is etched or oxidized only to a limited extent so as to leave intact the original pattern of the copper being etched. Typically, the surface of the copper is etched by an oxidative process only to a depth of between about 10 and about 500 micro-inches as measured from the original surface to the depths of the micro etching. This is accomplished by limiting the time of etching according to the parameters, e.g., concentrations, temperature, etc. of the etching solution.

Most commonly the proton source is a mineral acid, typically sulfuric acid, although other mineral acids such as nitric acid, phosphoric acid, etc. may be used as well. Also, strong organic acids, such as methanoic may be used as the proton source. Acids are typically used at between about 0.5 and about 7.5 moles per liter. Preferably, the sufficient acid is used such that the pH of the solution is about 4 or below.

Oxidizer agents include, but are not limited to peroxides, particularly hydrogen peroxide, persulfate compounds, ferric compounds, cupric compounds and nitric acid. The oxidizer agent is typically used at between about 0.2 wt % and about 5 wt % of the solution. Hydrogen peroxide, if used as the oxidizer agent is typically used at about 0.1 and about 3.5 moles per liter. The oxidizer agent in conjunction with the proton donor are the primary agents for providing the micro-etching. Depending upon the degree of micro-etching required, etching times may vary from about 0.1 about 10.0 menutes at temperatures between about 15 and about 70° C.

Deeper etching, and thereby better copper to resin adhesion is achieved by the inclusion of the azole compound at levels of between about 0.2 wt % and about 5 wt %, preferably between about 0.5 and about 2 wt %. The preferred azole compound is benzotriazole. Other suitable azole compounds include tolyltriazole, carbxoxytriazole, imidazole, tetrazole and salts of these compounds. Additional suitable azole compounds are described, for example, in U.S. Pat. No. 3,770,530, the teachings of which are incorporated herein by reference.

The micro-etching solution includes a halogen source which provides halogen ions at a level of between about 2 and about 50 parts per million by weight (ppm). Preferred halogen ions are chlorine, bromine and iodine, chlorine being the most preferred, although fluorine is acceptable as well. The source may be a halogen acid, such as HCl, HBr, HI, HF, or a salt, such as NaCl, etc.

The addition of the thiazole compound and/or thiocarbamide to the solution provides the micro-etched surface resistance to subsequent acid exposure. From the standpoint of minimizing processing steps, the thiazole and/or thiocarbamide compound is included in the micro-etching solution. The total level of the thiazole compound and/or the thiocarbamide compound in the micro-etching is at least about 0.05 wt %, preferably at least about 0.3 wt %, up to saturation levels. While applicants are not bound by theory, it is believed that the thiazole and/or thiocarbamide compound bonds to the copper surface, e.g., by chelation, and thereby renders the copper (and any copper oxide) inaccessible to subsequent acid attack.

Thiocarbamide (thiourea) is the preferred thiocarbamide compound, although substituted thiocarbamide compounds, such as described in U.S. Pat. No. 4,715,894, the teachings of which are incorporated by reference, may also be utilized in accordance with the invention.

Along with thiazole, substituted thiazoles may also be used in accordance with the present invention. Suitable substituted thiazoles include, but are not limited to 2-amino thiazole and 2-mercaptobenzothiazole. Of these, 2-aminothiazole has given the best acid-resistance to date.

The solution may optionally contain between about 0.2 and about 10 wt % of a metal-chelating agent, such as ethylenediaminetetraacetate.

The aqueous solution may optionally contain a surfactant at a level of between about 0.05 and about 10.0% by weight. Suitable surfactants include, but are not limited to polyalkoxylated alcohols, polyalkoxylated amines, sulfated and sulfonated amides, sulfated and sulfonated amines, glycerides and polyalkoxylated esters, betaines, and alcohols.

The aqueous solution may optionally contain between about 0.1 and about 49 wt % of a water-miscible organic solvent.

The aqueous solutions in accordance with the invention contain at least 40 wt % water.

As an alternative to including the thiazole compound and/or thiocarbamide compound in the micro-etching solution, an oxidatively micro-etched surface may be post-treated with an aqueous solution of a thiazole compound and/or thiocarbamide compound. Again, the total level of the thiazole compound and/or thiazole carbamide compound is at least about 0.2 wt %, preferably at least about 1 wt %, up to saturation levels.

The invention will now be described in greater detail by way of specific examples.

EXAMPLE 1

Four copper-clad circuitry board blanks were micro-etched to a brown color with an aqueous etchant solution containing 10 wt % sulfuric acid, 10 wt % hydrogen peroxide, 0.005 wt % hydrogen chloride, and 1 wt % benzotriazole. The boards were subsequently rinsed in water for 5 minutes and dried. One board was untreated while the other three were treated with an appropriate concentration of thiocarbamide (thiourea), 2-aminothiazole or 2-mercaptobenzothiazole. When these reagent's water solubility was low, these solutions were prepared with a glycol ether to facilitate their dissolutionment. The boards were immersed in HCl (10% by volume) at ambient temperature. The times for the boards to turn from brown to pink are as follows:

| Post Treatment | Concentration | Time to Pink |
| --- | --- | --- |
| Untreated | NA | 25 seconds |
| 2-mercaptobenzothiazole | 0.1% | 10 minutes |
| Thiourea | 0.1%, 1.0%, 10.0% | >1 hour |
| 2-aminothiazole | 0.1% | 5 minutes |

EXAMPLE 2

To a base etching solutions containing 10% sulfuric acid, 1% hydrogen peroxide, 0.005% Hydrochloric Acid and 1% benzotriazole were added: nothing as a control, 1.0% thiourea, 0.1% 2-aminothiazole and 2-mercaptobenzothiazole. Copper-clad circuit board blanks were etched for one min at 35° C. The boards were rinsed with water and dried. Subsequently, the boards were exposed to 10% by volume HCl at ambient temperatures. Times for the boards to turn from brown to pink are as follows:

| Etchant Additive | Concentration | Time to Pink |
| --- | --- | --- |
| Untreated | NA | 25 seconds |
| 2-mercaptobenzothiazole | 0.1% | 5 minutes |
| Thiourea | 1.0% | 5 minutes |
| 2-aminothiazole | 0.1%, 1.0% | >1 hour |

What is claimed is:

1. An aqueous solution for increasing surface area on a metal surface and providing said metal surface resistance to acid, the solution comprising a proton source;

an oxidizer agent;

a source of halogen ions;

an azole compound;

a compound selected from the group consisting of a thiazole compound, a thiocarbamide compound and mixtures thereof; and between about 0.1 and about 49% weight of a water-miscible organic solvent.

2. The aqueous solution according to claim 1 further comprising a metal-chelating agent.

3. The aqueous solution according to claim 2 wherein said chelating agent comprises between about 0.2% and about 10.0% by weight of said aqueous solution.

4. The aqueous solution according to claim 1 having a pH of about 4 or below.

5. The aqueous solution according to claim 1 containing between about 0.2 to about 5.0 wt % of said oxidizer agent.

6. The aqueous solution according to claim 1, wherein said oxidizer agent is selected from the group comprising of a peroxide compound, a persulfate compound, a ferric compound, a cupric compound, nitric acid, and mixtures thereof.

7. The aqueous solution according to claim 1, wherein said oxidizer agent is hydrogen peroxide.

8. The aqueous solution according to claim 1, wherein said proton source is selected from the group consisting of an organic, an inorganic acid and mixtures thereof.

9. The aqueous solution according to claim 1, wherein said proton source is selected from the group consisting of sulfuric aced, nitric acid, phosphoric acid, hydrofluoric acid, methanoic acid, phenylsulfonic acid and mixtures thereof.

10. The aqueous solution according to claim 1, wherein said thiazole compound is selected from the group consisting of 2-aminothiazole, 2-mercaptobenzothiazole and mixtures thereof.

11. The aqueous solution according to claim 1, wherein said thiocarbamide compound is thiocarbamide (thiourea).

12. The aqueous solution according to claim 1, wherein said thiazole compound and/or said thiocarbamide compound is present at a level of at least about 0.2 wt % of said aqueous solution up to saturation level.

13. The aqueous solution according to claim 1, wherein said halogen ion source provides halogen ion at between about 2 and 50 ppm.

14. The aqueous solution according to claim 1, wherein said halogen ion source provides halogen ions selected from the group consisting of chlorine, bromine, iodide, and mixtures thereof.

15. The aqueous solution according to claim 1 wherein said azole compound is present in an amount of between about 0.2 and about 5.0% by weight of said aqueous solution.

16. The aqueous solution according to claim 15, wherein said azole compound is selected from the group consisting of benzotriazole, tolyltriazole, carboxytriazole, imidazole, tetrazole, salts of these compounds and mixtures thereof.

17. The aqueous solution according to claim 1, further comprising a surfactant.

18. The aqueous solution according to claim 17, wherein said surfactant is present at between about 0.05 and about 10.0 wt %.

19. The process for creating increased surface area on a metal surface which exhibits resistance to subsequent exposure to acid comprising exposing said metal surface to the aqueous solution of claim 1 for a time sufficient to increase the surface area of said metal surface.

20. The process according to claim 19, wherein said metal is selected from the group consisting of copper, nickel, cadmium, zinc, iron, aluminum, and alloys thereof.

21. The process according to claim 19, wherein said metal is copper or a copper alloy.

* * * * *